(12) United States Patent
Wang et al.

(10) Patent No.: US 10,587,093 B2
(45) Date of Patent: Mar. 10, 2020

(54) CONNECTION STRUCTURE FOR LASER AND LASER ASSEMBLY

(71) Applicants: Hisense Broadband Multimedia Technologies Co., Ltd, Qingdao, Shandong (CN); Hisense USA Corp., Suwanee, GA (US); Hisense International Co., Ltd., Qingdao, Shandong (CN)

(72) Inventors: Hao Wang, Qingdao (CN); Hongwei Mu, Qingdao (CN); YongLiang Huang, Qingdao (CN); Shun Zhang, Qingdao (CN)

(73) Assignees: HISENSE BROADBAND MULTIMEDIA TECHNOLOGIES CO., LTD., Qingdao (CN); HISENSE USA CORP., Suwanee, GA (US); HISENSE INTERNATIONAL CO., LTD., Qingdao (CN)

( * ) Notice: Subject to any disclaimer, the term of this patent is extended or adjusted under 35 U.S.C. 154(b) by 0 days.

(21) Appl. No.: 15/853,003

(22) Filed: Dec. 22, 2017

(65) Prior Publication Data

US 2018/0138656 A1 May 17, 2018

Related U.S. Application Data

(63) Continuation of application No. 14/944,379, filed on Nov. 18, 2015, now Pat. No. 9,853,414.

(30) Foreign Application Priority Data

Mar. 30, 2015 (CN) .......................... 2015 1 0145308

(51) Int. Cl.
*H01S 5/022* (2006.01)
*H01S 5/024* (2006.01)

(52) U.S. Cl.
CPC ...... *H01S 5/02236* (2013.01); *H01S 5/02216* (2013.01); *H01S 5/02284* (2013.01); *H01S 5/02276* (2013.01); *H01S 5/02469* (2013.01)

(58) Field of Classification Search
CPC . H01S 5/02236–02276; H01S 5/02469; H01S 5/02476; H01S 5/022;
(Continued)

(56) References Cited

U.S. PATENT DOCUMENTS 4,922,325 A * 5/1990 Smeltz, Jr. ........ H01L 23/49822
174/266
5,875,204 A 2/1999 Sato
(Continued)

FOREIGN PATENT DOCUMENTS

CN 1501482 A 6/2004
CN 1812697 A 8/2006
(Continued)

OTHER PUBLICATIONS

First Chinese Office Action dated May 9, 2017 to Chinese Application No. 201510145308.X, and English Translation, (12p).
(Continued)

*Primary Examiner* — Tod T Van Roy
*Assistant Examiner* — Delma R. Fordé
(74) *Attorney, Agent, or Firm* — Brinks Gilson & Lione

(57) ABSTRACT

A connection structure for a laser and a laser assembly are provided. The connection structure for a laser includes a first insulation substrate, where the first insulation substrate includes a conductive path separately on an upper surface and a lower surface thereof. A second insulation substrate is disposed on the upper surface of the first insulation substrate. An upper surface of the second insulation substrate includes a conductive path. The conductive path on the upper surface of the second insulation substrate is electri-
(Continued)

cally connected to the conductive path on the lower surface of the first insulation substrate via a through-hole. The connection structure for a laser and the laser assembly in the present disclosure are configured to supplying power to a laser.

18 Claims, 7 Drawing Sheets

(58) Field of Classification Search
CPC ............ H01S 5/02216; H01L 23/00; H01L 23/49827; H01L 23/49822; H01L 23/49833; H01L 23/147; H01L 23/49861; H01L 23/5385; H01L 23/4926; H01L 23/5384; H01L 21/486; H01L 33/62; G02B 6/4274
See application file for complete search history.

(56) References Cited

U.S. PATENT DOCUMENTS

| | | | |
|---|---|---|---|
| 6,774,748 B1* | 8/2004 | Ito | H01L 23/057 257/664 |
| 7,751,458 B2 | 7/2010 | Regaard et al. | |
| 9,335,022 B2 | 5/2016 | Lee | |
| 9,413,131 B1* | 8/2016 | Wang | H01S 5/02407 |
| 2003/0128552 A1* | 7/2003 | Takagi | G02B 6/4201 362/555 |
| 2003/0214031 A1 | 11/2003 | Onoue | |
| 2004/0021217 A1* | 2/2004 | Epitaux | H01S 5/02216 257/700 |
| 2004/0264882 A1 | 12/2004 | Torigoe et al. | |
| 2005/0214957 A1* | 9/2005 | Kihara | G02B 6/4201 438/14 |
| 2007/0241447 A1* | 10/2007 | Cheung | H01L 23/10 257/704 |
| 2009/0010652 A1* | 1/2009 | Iwafuji | H01L 25/167 398/135 |
| 2009/0029570 A1 | 1/2009 | Ikeuchi et al. | |
| 2009/0243115 A1* | 10/2009 | Lee | G11C 5/02 257/773 |
| 2011/0048796 A1* | 3/2011 | Tsujino | H01L 23/49833 174/549 |
| 2011/0294308 A1 | 12/2011 | Kuwata et al. | |
| 2011/0298568 A1 | 12/2011 | Uchimura et al. | |
| 2012/0087136 A1 | 4/2012 | Kuwahara | |
| 2012/0235764 A1 | 9/2012 | Kang et al. | |
| 2013/0051413 A1* | 2/2013 | Chen | H01S 5/02 372/36 |
| 2013/0265734 A1 | 10/2013 | Herbsommer et al. | |

FOREIGN PATENT DOCUMENTS

| | | |
|---|---|---|
| CN | 1866650 A | 11/2006 |
| CN | 1902763 A | 1/2007 |
| CN | 101246266 A | 8/2008 |
| CN | 101794929 A | 8/2010 |
| CN | 102393863 A | 3/2012 |
| CN | 103762400 A | 4/2014 |
| JP | 2001251009 A | 9/2001 |

OTHER PUBLICATIONS

First Chinese Office Action to Chinese Application No. 201510145276.3 dated Feb. 20, 2017 along with English Translation, (12p).

Fikar, Stefan, et al., "*A 100GHz Bandwidth Matched Chip to PCB Transition Using Bond Wires for Broadband Matching*,"Published in Signal Propagation on Interconnects, SPI 2008, 12th IEEE Workshop, May 12-15, 2008, http://ieeexplore.eee.org/document/4558360/, (11p).

Sakai, Kiyohide, et al., "1.3-μm *Uncooled DFB Laser-Diode Module With a Coupled Differential Feed for 10-Gb/s Ethernet Applications*,"Journal of Lightwave Technology, vol. 22, No. 2, Feb. 2004, pp. 574-581, http://ieeexplore.ieee.org/document/1278501/, (23p).

Xing, "*Numerical Calculation and Simulation Analysis of Electromagnetic Field*",Jun. 30, 2014, p. 154, Published by National Defense Industry Press, Beijing, China. Along with Concise Explanation of the book page in English, (9p).

\* cited by examiner

CONNECTION STRUCTURE FOR LASER AND LASER ASSEMBLY

CROSS-REFERENCE TO RELATED APPLICATION

This application is a continuation under 35 U.S.C. § 120 of U.S. application Ser. No. 14/944,379 filed on Nov. 18, 2015, pending, which claims priority of Chinese Patent Application No. 201510145308.X filed on Mar. 30, 2015, both of which are hereby incorporated by reference in their entireties.

TECHNICAL FIELD

The present disclosure relates to the technical field of optical fiber communications, and in particular, to a connection structure for a laser and a laser assembly.

BACKGROUND

In recent years, with a great amount of FTTH (Fiber To The Home) and 3G/4G network construction in China, demands for optical devices become greater, and a system vendor's requirements for optical devices also become higher. As a result, development of optical devices featuring a high rate, long-distance transmission, miniaturization and low power consumption has become a focus that attracts attention of equipment vendors and device vendors.

With miniaturization development of a laser transmitter, packaging manner thereof has changed from conventional Butterfly packaging to XMD (10 Gbit/s Miniature Device) packaging. When the number of demanded pins is large, if the pins are all disposed at a same side surface of a ceramic substrate, volume of the ceramic substrate needed for use is accordingly increased, so that the laser transmitter occupies a greater space, which goes against miniaturization development of a laser transmitter. Therefore, in the existing technology, pins are welded to opposite surfaces of a same ceramic substrate, so as to reduce volume of the ceramic substrate. As shown in FIG. 1, provided is a schematic diagram of an existing laser transmitter adopting XMD packaging, which includes an optical fiber adapter 01, a cavity 02 and pins 03. Electrical components of the laser transmitter include a laser inside the cavity 02 and another electrical component (not shown in the figure). Light emitted by the laser enters an optical fiber through the optical fiber adaptor 01. The pins 03 are welded to opposite surfaces of a same ceramic substrate (not shown in the figure) in the cavity 02, and are connected to an external circuit for supplying power to the laser and the another electrical component.

FIG. 2 is a schematic diagram of an internal structure of the laser cavity 02 shown in FIG. 1. FIG. 3 is a schematic diagram of a ceramic substrate in FIG. 2. The cavity 02 includes a heat sink 04, a laser 05 and a first ceramic substrate 06. A conductive layer is adhered to a surface of the heat sink 04, and a cathode of the laser 05 is laminated on the conductive layer. The laser 05 has an anode welding spot 051 on an upper surface thereof. The first ceramic substrate 06 includes a conductive path 0A on an upper surface thereof, and a conductive path 0B on a lower surface thereof. The conductive paths 0A and 0B are respectively welded to pins 03 located on opposite surfaces of the first ceramic substrate 06. The anode welding spot 051 is connected to the conductive path 0A on the upper surface of the first ceramic substrate 06 via a metal wire in a wire bonding manner. The pins 3 are welded to the conductive path 0A, thereby achieving an electrical connection of the laser 05 and the pins 03 welded onto the conductive path 0A.

The existing manufacturing process of a laser transmitter cannot achieve wire bonding in opposite directions, that is, cannot achieve establishing an electrical connection on opposite surfaces of a ceramic substrate both in a wire bonding manner. However, the pins 03 are welded to opposite surfaces of the first ceramic substrate 06, so that if an electrical connection to a conductive path on a surface is established in a wire bonding manner, an electrical connection to a conductive path on another surface cannot be established in a wire bonding manner. For such a problem, a second ceramic substrate 07 is added. Referring to FIG. 2, FIG. 3 and FIG. 4, the second ceramic substrate 07 includes a conductive path 0C on an upper surface thereof. A surface where the conductive path 0B is located is laminated onto a surface where the conductive path 0C is located, so as to achieve abutting of the conductive path 0B and the conductive path 0C. Then, the conductive layer is located at a same horizontal plane with the surface where the conductive path 0C on the second ceramic substrate 07 is located. A metal wire is connected to the conductive path 0C of the second ceramic substrate 07 in a wire bonding manner. Through transferring by abutted conductive paths, the laser 05 is electrically connected to the pins 03 welded on the conductive path 0B.

However, due to a narrow conductive path and limited manufacturing process, as shown in FIG. 5, this transferred connection method may causes the conductive paths 0B and 0C to be displaced during abutting, so that a relatively great error exists and consequently causes damage to impedance matching that is preset for high-frequency signals. Impedance matching is a part of microwave electronics, and is mainly used in transmission lines, so as to achieve an objective that all high-frequency microwave signals can be transmitted to a load point, without any signal reflected back to an original point, thereby improving quality of high-frequency signals. High-rate signal transmission requires that a laser transmitter shall meet requirements for impedance matching demanded by high-frequency signals.

SUMMARY

Embodiments of the present disclosure provide a connection structure for a laser and a laser assembly, so as to achieve an electrical connection of a laser and conductive paths that are distributed on an upper surface and a lower surface of a same substrate in a wire bonding manner, on the premise of meeting requirements for impedance matching.

To achieve the above objective, the embodiments of the present disclosure adopt the following technical solutions:

A connection structure for a laser is provided, including a first insulation substrate, wherein the first insulation substrate includes a conductive path separately on an upper surface and a lower surface thereof; the upper surface of the first insulation substrate includes a second insulation substrate; an upper surface of the second insulation substrate includes a conductive path; and the conductive path on the upper surface of the second insulation substrate is electrically connected to the conductive path on the lower surface of the first insulation substrate via a through-hole.

In the connection structure for a laser provided by this embodiment of the present disclosure, to achieve connection of a laser and conductive paths that are distributed on opposite surfaces of a same substrate in a wire bonding manner, a second insulation substrate is disposed on an upper surface of a first insulation substrate, and a conductive path on an upper surface of the second insulation substrate is electrically connected to a conductive path on a lower surface of the first insulation substrate via a through-hole. During packaging, the laser can not only be connected to a conductive path on the upper surface of the first insulation substrate via a metal wire in a wire bonding manner so as to achieve transmission of high-frequency signals, but also connected to the conductive path on the upper surface of the second insulation substrate in a wire bonding manner. As the conductive path on the upper surface of the second insulation substrate is connected to the conductive path on the lower surface of the first insulation substrate via a through-hole, the laser can be connected to the conductive path on the lower surface of the first insulation substrate. Thus, the laser can be electrically connected to conductive paths distributed on the upper and lower surfaces of a same substrate. Compared with the existing technology, the connection structure of the present disclosure achieves, by means of adopting a solution of transferred connection via a through-hole, simultaneous electrical connection of a laser and conductive paths distributed on an upper surface and a lower surface of a same substrate in a wire bonding manner. In addition, as a conductive path on the upper surface of a first insulation substrate can be directly configured to transmit of high-frequency signals, a problem of impedance non-matching will not occur.

An embodiment of the present disclosure further provides a laser assembly, including a housing that is provided inside with a heat sink, the heat sink being provided with a laser, where the laser assembly further includes a connection structure for a laser as described above; an end of the connection structure far away from the pins is inserted into the housing; and conductive paths of the connection structure are electrically connected to the laser in a wire bonding manner.

In the laser assembly provided by this embodiment of the present disclosure, to supply power to a laser and another electrical component via pins, a connection structure is disposed within a housing thereof. The laser is connected to a conductive path on an upper surface of a first insulation substrate of the connection structure via a metal wire in a wire bonding manner, and is connected to a conductive path on an upper surface of a second insulation substrate in a same connection manner. As the conductive path on the upper surface of the second insulation substrate is connected to a conductive path on a lower surface of the first insulation substrate, the laser is then connected to the conductive path on the lower surface of the first insulation substrate, thereby achieving an electrical connection of the laser and all the pins. Compared with the existing technology, the connection structure of the present disclosure achieves, by means of adopting a solution of transferred connection via a through-hole, simultaneous electrical connection of a laser and conductive paths distributed on an upper surface and a lower surface of a same substrate in a wire bonding manner, and avoids using a conductive path-abutting transfer structure. Thus, pins on an upper surface of a lower substrate can be directly configured to transmit of high-frequency signals, thereby solving a problem of damage to impedance matching that is preset for high-frequency signals provided for the laser due to using a conductive path-abutting transfer structure.

BRIEF DESCRIPTION OF THE DRAWINGS

To illustrate the technical solutions in the embodiments of the present disclosure more clearly, the following briefly introduces the accompanying drawings required for describing the embodiments or the prior art. Apparently, the accompanying drawings in the following description show merely some embodiments of the present disclosure, and a person of ordinary skill in the art may still derive other drawings from these accompanying drawings without creative efforts.

DETAILED DESCRIPTION

Figure 1:
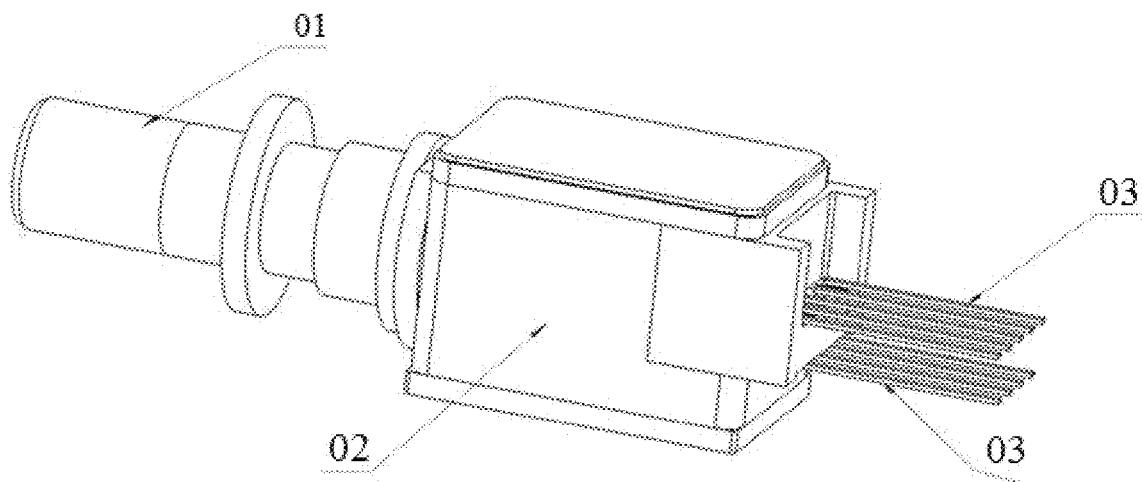
FIG. 1 is a schematic view of a laser transmitter adopting XMD packaging according to the existing technology.
Figure 2:
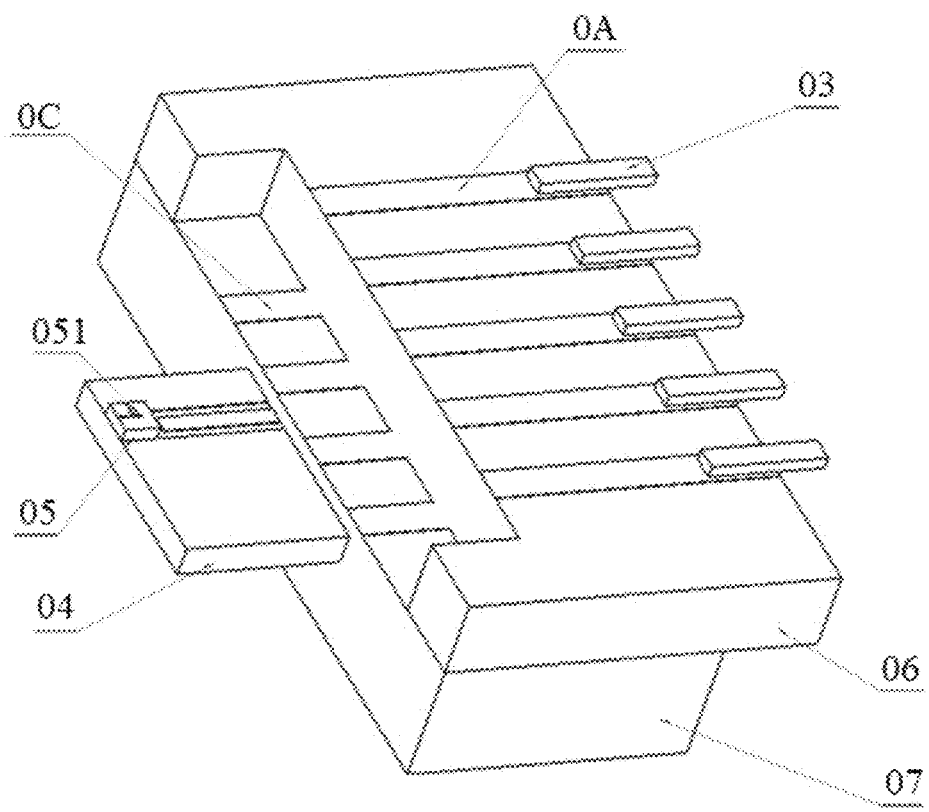
FIG. 2 is a schematic view of an internal structure of a laser transmitter cavity in FIG. 1.
Figure 3:
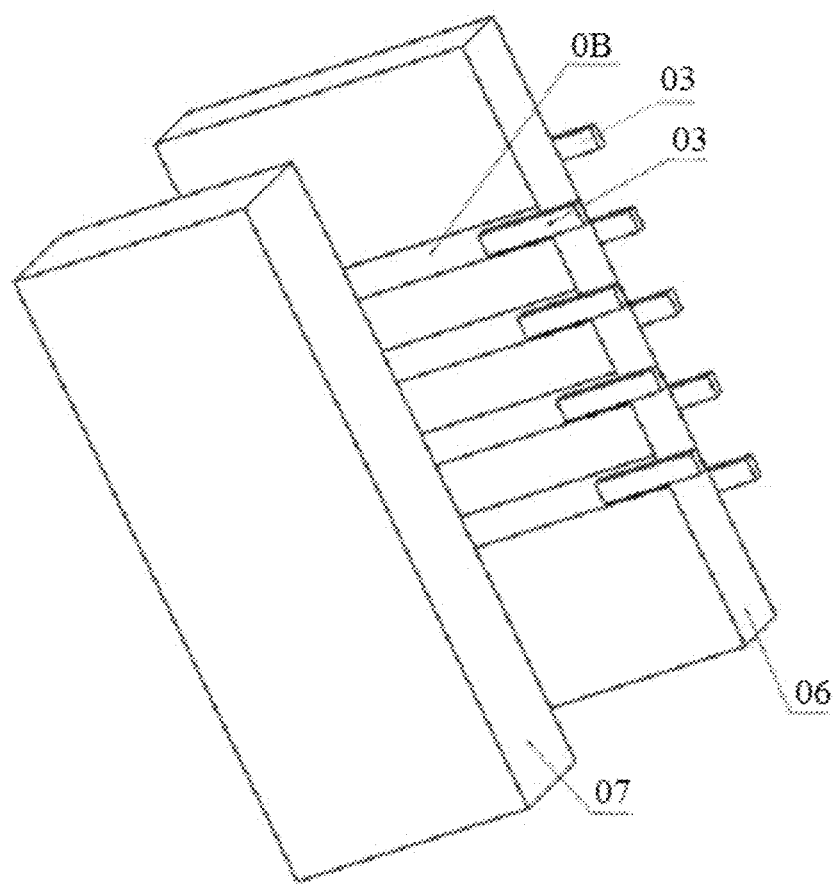
FIG. 3 is a schematic view of a ceramic substrate in FIG. 2.
Figure 4:
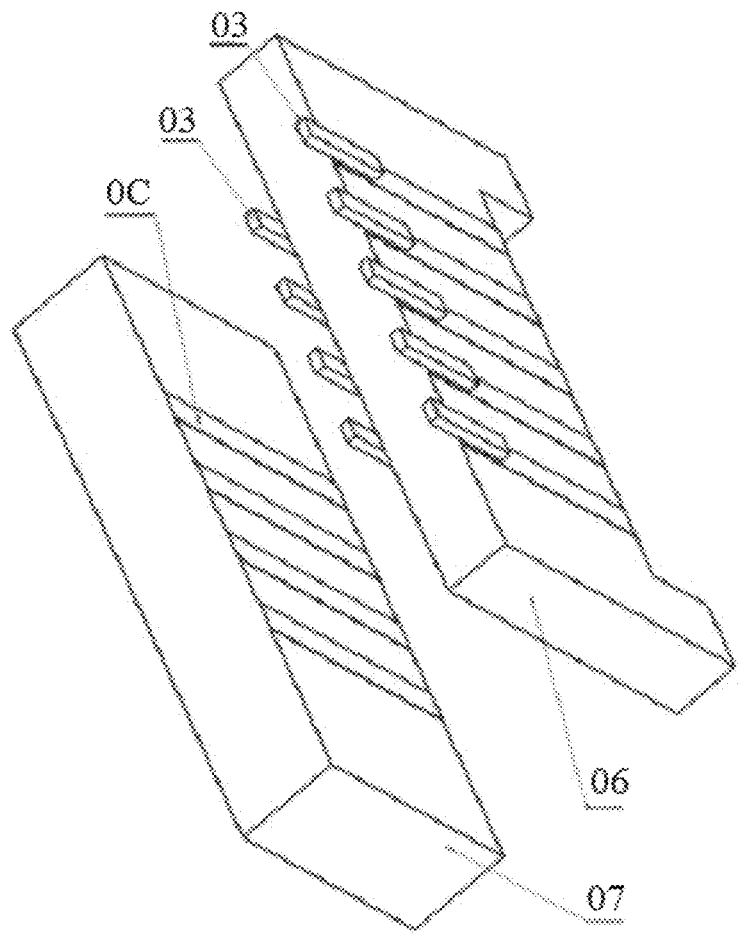
FIG. 4 is a schematic view from another angle of a ceramic substrate in FIG. 2.
Figure 5:
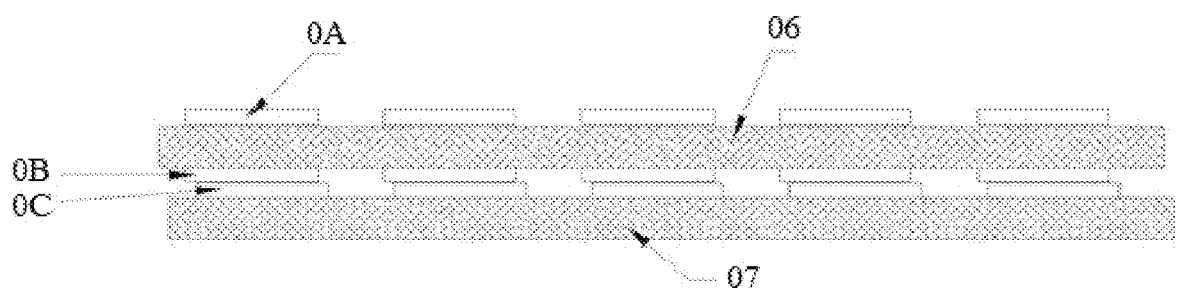
FIG. 5 is a sectional view of a ceramic substrate in FIG. 2.

Throughout the specification and claims, terms may have nuanced meanings suggested or implied in context beyond an explicitly stated meaning. Likewise, the phrase "in one embodiment" as used herein does not necessarily refer to the same embodiment and the phrase "in another embodiment" as used herein does not necessarily refer to a different embodiment. It is intended, for example, that claimed subject matter include combinations of example embodiments in whole or in part.

In general, terminology may be understood at least in part from usage in context. For example, terms, such as "and", "or", or "and/or," as used herein may include a variety of meanings that may depend at least in part upon the context in which such terms are used. Typically, "or" if used to associate a list, such as A, B or C, is intended to mean A, B, and C, here used in the inclusive sense, as well as A, B or C, here used in the exclusive sense. In addition, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

Various units, circuits, or other components may be described or claimed as "configured to" perform a task or tasks. In such contexts, "configured to" is used to connote structure by indicating that the units/circuits/components include structure (e.g., circuitry) that performs those task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. section 112, sixth paragraph, for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue.

In the description of the present disclosure, it should be understand that positions and positional relationships indicated by the terms such as "center", "above", "below", "in front of", "behind", "left", "right", "vertical", "horizontal", "top", "bottom", "inside", "outside" are based on the position or positional relationship shown in the accompany drawings, which are used only for convenient and brief description, and do not indicate or imply that the indicated apparatus or element must be in a specific position, and must be constructed and operated in a specific position. In addition, in embodiments of the present disclosure, an inner end and an outer end are both defined according to directions of signals in a transmission path, that is, according to directions of signals in a transmission path, one end for inputting signals is defined as the outer end or a signal input end of the transmission path, and another end for outputting signals is defined as the inner end or a signal output end. Of course, other names may be defined according to principles, and thus the foregoing cannot be understood as a limitation on the present disclosure.

The following clearly and completely describes the technical solutions in the embodiments of the present disclosure with reference to the accompanying drawings in the embodiments of the present disclosure. Apparently, the described embodiments are merely some of the embodiments of the present disclosure rather than all of the embodiments. All other embodiments obtained by a person of ordinary skill in the art based on the embodiments of the present disclosure without creative efforts, shall fall within the protection scope of the present disclosure.

In the description of the present disclosure, it should be understood that, orientation or position relations indicted by terms such as "center", "upper", "lower", "front", "back", "left", "right", "vertical", "horizontal", "top", "bottom", "internal" and "external" are orientation or position relations shown based on the accompanying drawings, and merely used for convenient and simple description of the present disclosure, but do not indicate or imply that an indicated apparatus or element must have a specific orientation, or be constructed and operated at a specific orientation. Therefore, the orientation or position relations shall not be understood as a limitation to the present disclosure.

Terms "first" and "second" are only used for the purpose of description, but cannot be understood as an indication or implication of relative importance, or quantity of technical characteristics that are indicated. Thus, a characteristic restricted by "first" or "second" may indicate or imply that one or more such characteristics are included. In the description of the present disclosure, unless otherwise stated, "a plurality of" means two or more.

In the description of the present disclosure, it should be noted that, unless otherwise explicitly specified and restricted, terms "installation", "interconnection" and "connection" should be understood in a broad sense. For example, it may be a fixed connection, a detachable connection, or an integral connection; it may be a mechanical connection, or an electrical connection; and it may be a direct interconnection, or an indirect interconnection via an intermediate, or an internal interconnection of two elements. For a person of ordinary skill in the art, specific meaning of the foregoing terms in the present disclosure can be understood according to specific conditions.

In the description of the present disclosure, "outer end" refers to an end far away from a laser when a connection structure is connected to the laser; and "inner end" refers to an end close to a laser when a connection structure is connected to the laser.

Referring to FIG. 1, the structure of a laser transmitter adopting XMD packaging includes an optical fiber adapter 01, a cavity 02, and pins 03. Electrical components of the laser transmitter include a laser inside the cavity 02 and another electrical component (not shown in the figure). The another electrical component generally includes a modulator, a cooler, a thermistor, a backlight detection unit, and the like. Light emitted by the laser enters an optical fiber through the optical fiber adaptor 01. The pins 03 are welded to opposite surfaces of a same ceramic substrate in the cavity 02, and are connected to an external circuit for supplying power to the laser and the another electrical component.

Figure 6:
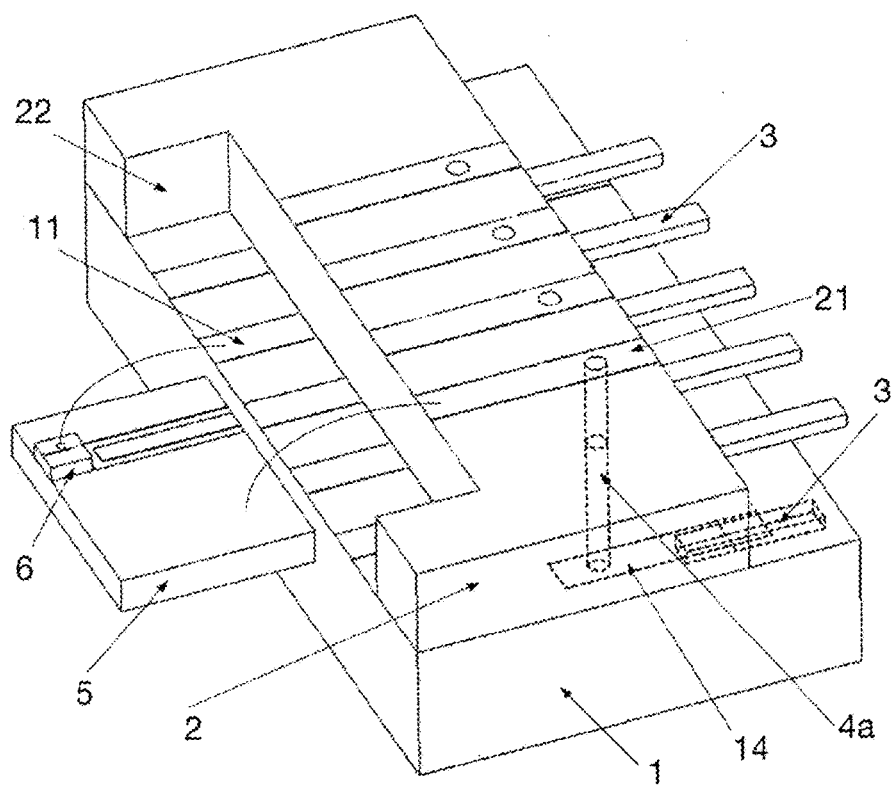
FIG. 6 is a schematic view of a connection structure according to an embodiment of the present disclosure.
Figure 7:
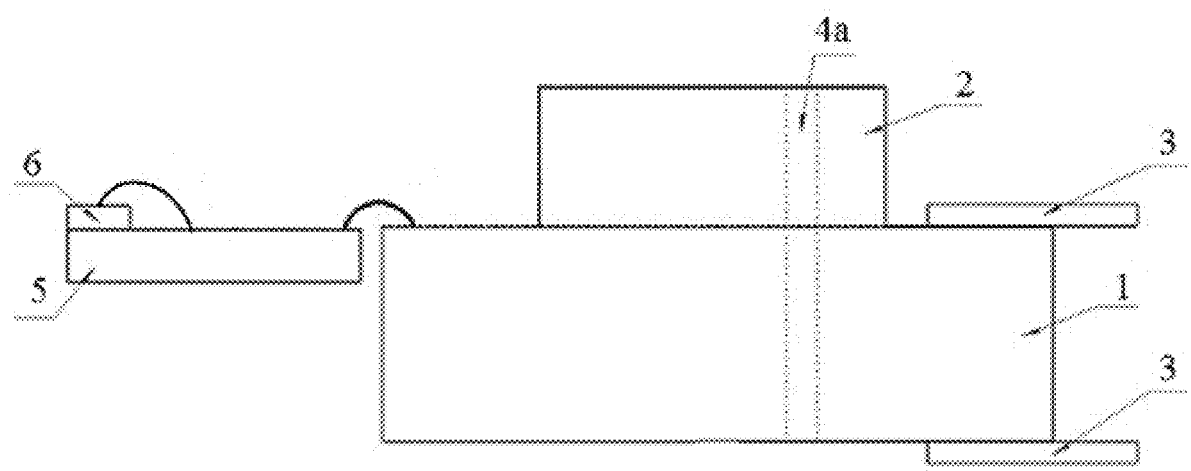
FIG. 7 is a side view of a connection structure according to an embodiment of the present disclosure.
Figure 8:
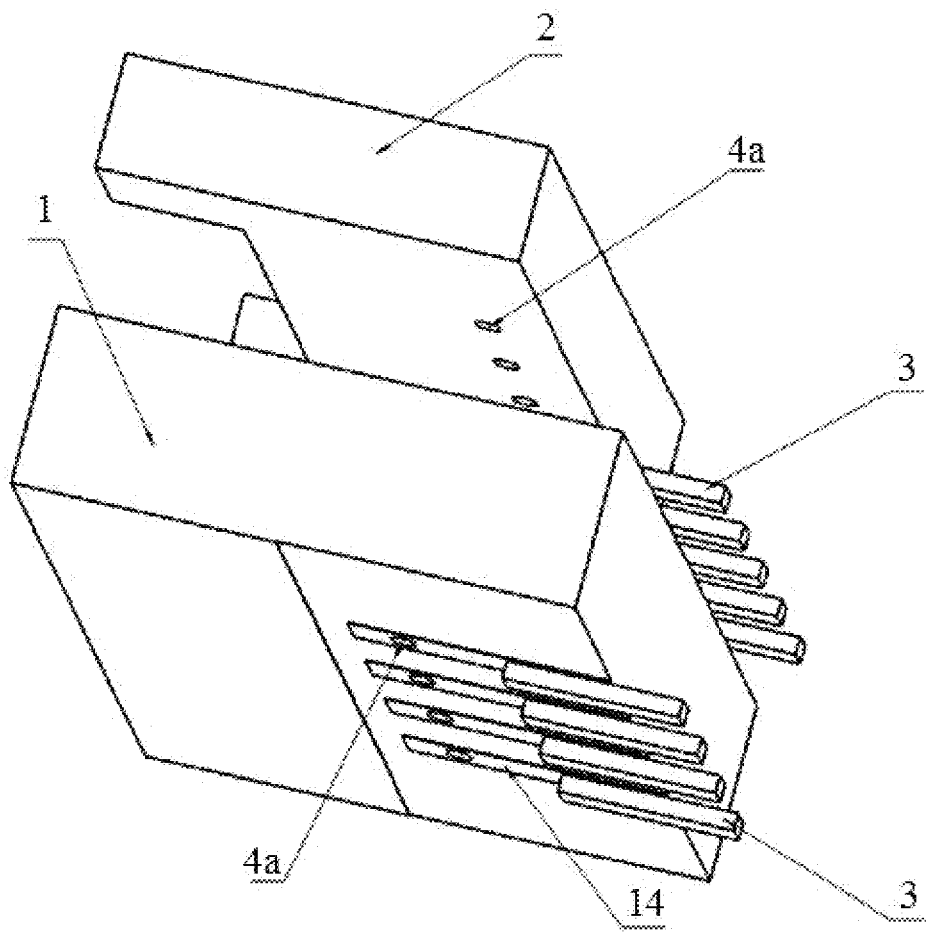
FIG. 8 is a schematic view of connection between a first insulation substrate and a second insulation substrate according to an embodiment of the present disclosure.

FIG. 6 shows a specific embodiment of a connection structure for a laser according to an embodiment of the present disclosure. In this embodiment, the connection structure for a laser is mainly configured to connect a laser to an external circuit, and supplying power to the laser. The connection structure includes a first insulation substrate 1. The first insulation substrate 1 includes a conductive path 11 on an upper surface and a conductive path 14 on a lower surface thereof. The laser is connected to the conductive paths, and then the conductive paths are connected to an external circuit, so as to achieve power supply to the laser. Compared with a solution of disposing conductive paths on a same surface of an insulation substrate in the existing technology, the conductive paths can be separately disposed on an upper surface and a lower surface of a same insulation substrate in such a manner, thereby reducing the area of the insulation substrate and making the laser more miniaturized. An outer end of conductive path 11 and conductive path 14 is connected to a pin 3. Configuration of the pin 3 can facilitate connecting the conductive path 11 and the conductive path 14 to an external circuit. Specifically, the number of conductive paths 11 on an upper surface of the first insulation substrate 1 is 5, and accordingly, the number of pins 3 connected to the conductive paths 11 on the upper surface is also 5; the number of conductive paths 11 on a lower surface of the first insulation substrate 1 is 4, and accordingly, the number of pins 3 connected to the conductive paths 14 on the lower surface is also 4. The number of conductive paths that are configured may be selected according to the number of components to be connected in the laser. The upper surface of the first insulation substrate 1 includes a second insulation substrate 2, so as to facilitate achieving transferred connection of conductive paths. In addition, an upper surface of the second insulation substrate 2 includes conductive paths 21. The number of conductive paths 21 on the upper surface of the second insulation substrate 2 is equal to the number of conductive paths 14 on the lower surface of the first insulation substrate 1, namely, 4, so that the conductive paths 21 on the upper surface of the second insulation substrate 2 are correspondingly connected to the conductive paths 14 on the lower surface of the first insulation substrate 1 via a through-hole 4a. In this way, the conductive path 14 on the lower surface of the first insulation substrate 1 is connected to the conductive path 21 on the upper surface of the second insulation substrate 2. Then, an input end of the laser, an input end of the modulator, positive and negative electrodes of the cooler, the thermistor, and the backlight detection unit are respectively connected to the conductive path 11 on the upper surface of the first insulation substrate 1 and conductive path 21 on the upper surface of the second insulation substrate 2. The pin 3 is then connected to an external circuit, so as to achieve power supply to the laser, the cooler and other electrical components, as well as return of thermistor signals and detection current of the backlight detection unit.

In the connection structure for a laser provided by this embodiment of the present disclosure, to achieve connection of a laser and conductive paths that are distributed on opposite surfaces of a substrate in a wire bonding manner, a second insulation substrate 2 is disposed on an upper surface of a first insulation substrate 1, and a conductive path 21 on an upper surface of the second insulation substrate is electrically connected to a conductive path 14 on a lower surface of the first insulation substrate 1 via a through-hole 4a. During packaging, the laser can not only be connected to the conductive path 11 on the upper surface of the first insulation substrate 1 via a metal wire in a wire bonding manner so as to achieve transmission of high-frequency signals, but also connected to the conductive path 21 on the upper surface of the second insulation substrate 2 in a wire bonding manner. As the conductive path 21 on the upper surface of the second insulation substrate 2 is connected to the conductive path 14 on the lower surface of the first insulation substrate 1 via the through-hole 4a, the laser can be connected to the conductive path 14 on the lower surface of the first insulation substrate 1. Thus, the laser can be electrically connected to conductive paths distributed on the upper and lower surfaces of a same substrate. Compared with the existing technology, the connection structure of the present disclosure achieves, by means of adopting a solution of transferred connection via a through-hole, simultaneous electrical connection of a laser and conductive paths distributed on an upper surface and a lower surface of a same substrate. In addition, as a conductive path on an upper surface of a first insulation substrate can be directly configured to transmit of high-frequency signals, a problem of impedance non-matching will not occur.

Referring to FIG. 6, to facilitate connecting the laser to the conductive path 11 on the upper surface of the first insulation substrate 1 in a wire bonding manner, an end of the second insulation substrate 2 far away from the pin 3 includes a notch 22. The notch 22 can expose an end part of the conductive path 11 on the upper surface of the first insulation substrate 1. Alternatively or additionally, the first insulation substrate 1 and the second insulation substrate 2 may be directly disposed in a misaligned manner, so as to expose the end part of the conductive path 11 on the upper surface of the first insulation substrate 1. Thus, the laser may be connected to an exposed end of the conductive path 11 on the upper surface of the first insulation substrate 1 in a wire bonding manner. Under a circumstance that the substrate size is fixed, disposing two substrates in a misaligned manner may occupy more space. Therefore, the solution of FIG. 6 is preferably adopted.

To achieve an electrical connection of the conductive path 21 on the upper surface of the second insulation substrate 2 and the conductive path 14 on the lower surface of the first insulation substrate 1 via a through-hole 4a, and avoid the through-hole 4 being in contact with the conductive path 11 on the upper surface of the first insulation substrate 1, it may be configured that projection of the conductive path 21 on the upper surface of the second insulation substrate 2 onto the upper surface of the first insulation substrate 1 does not overlap with the conductive path 11 on the upper surface of the first insulation substrate 1. Thus, when setting the through-hole 4a, the through-hole 4a may be prevented from contacting the conductive path 11 on the upper surface of the first insulation substrate 1. In addition, to connect the conductive path 21 on the upper surface of the second insulation substrate 2 to the conductive path 14 on the lower surface of the first insulation substrate 1 via a vertical through-hole, projection of the conductive path 21 on the upper surface of the second insulation substrate 2 onto the lower surface of the first insulation substrate 1 may partially overlap with the conductive path 14 on the lower surface of the first insulation substrate 1. In this way, the electrical connection of the conductive path 21 on the upper surface of the second insulation substrate 2 and the conductive path 14 on the lower surface of the first insulation substrate 1 can be achieved via the vertical through-hole 4a.

Figure 11:
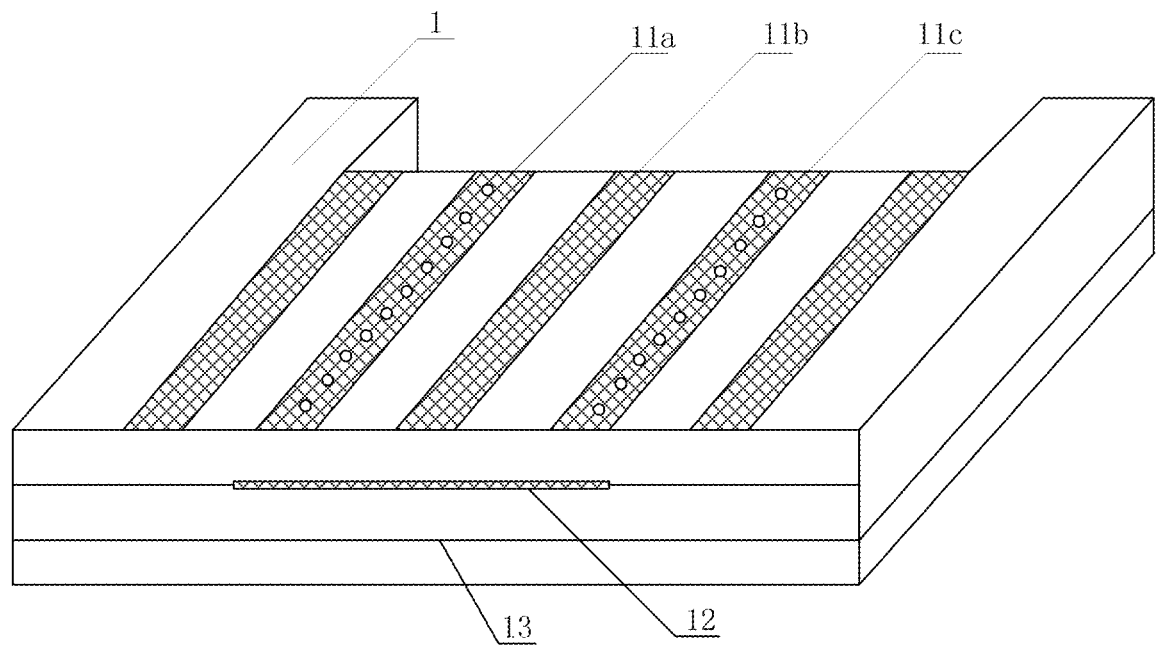
FIG. 11 is a schematic view of a conductive path on a first insulation substrate according to an embodiment of the present disclosure.
Figure 12:
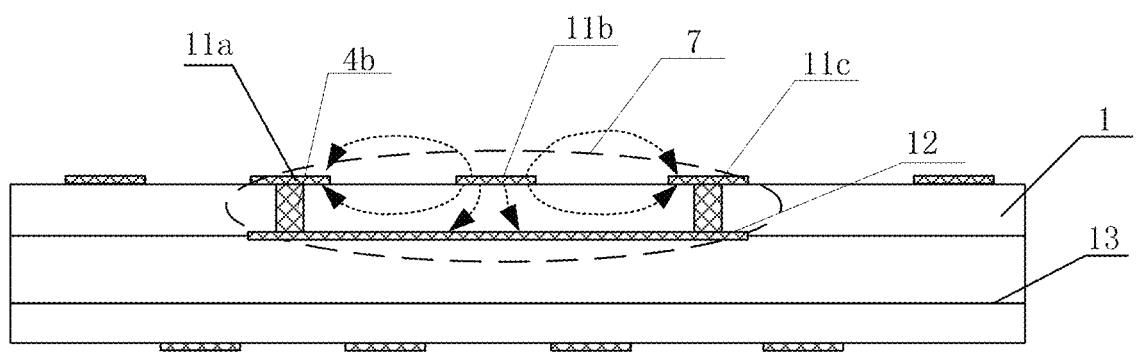
FIG. 12 is a schematic structural view of a micro-strip line in a first insulation substrate according to an embodiment of the present disclosure.

As connection of high-frequency signals of a laser needs to follow a rule that one or one group of high-frequency signal lines (S) shall be wrapped by two ground wires (G), in FIG. 11 and FIG. 12, the conductive path 11 on the upper surface of the first insulation substrate 1 includes at least two conductive paths 11a and 11c configured to provide a ground wire, and a conductive path 11b that is configured to provide a signal line and located between the two conductive paths 11a and 11c configured to provide a ground wire. The conductive path 11b configured to provide a signal line is connected to an anode welding spot of the laser for transmission of high-frequency signals on an anode of the laser. The conductive paths 11a and 11c configured to provide a ground wire are separately connected to a cathode of the laser. The first insulation substrate 1 is provided inside with a first conductive interlayer 12, and the first conductive interlayer 12 is a reference layer. The reference layer is electrically connected to the conductive paths 11a and 11c configured to provide a ground wire via a through-hole 4b, for grounding of the cathode of the laser. The conductive paths (11a, 11b, 11c), the first conductive interlayer 12 and the through-hole 4b constitute a micro-strip line structure 7. When high-frequency signals are provided in the form of GSG as described above, the conductive paths 11a and 11c are connected to the first conductive interlayer 12, so as to achieve grounding of the cathode of the laser. The conductive path 11b is configured to transmit of high-frequency signals. Because a side of the conductive paths 11a, 11b and 11c in the micro-strip line structure 7 is an air medium with a low dielectric constant, and another side thereof is the first insulation substrate 1 with a high dielectric constant, transmission rate of high-frequency signals is improved.

In addition, when a group of high-frequency signal lines (S) are wrapped by two ground wires (G), the group of high-frequency signal lines may be two lines with a same length and width that are close to each other, that is, constitute a differential signal line. Then, a signal line is connected to an anode welding spot of the laser, and another signal line is connected to a cathode of the laser, so as to transmit signals on two lines. Compared with a conventional method of a signal line and a ground wire, amplitudes of differential signals are identical, and amplitudes of coupled electromagnetic fields between the two lines and the ground wire are also identical, but signal polarities are opposite, so that electromagnetic fields will offset each other. In addition, interference noise may generally be loaded simultaneously onto two signal lines at a same intensity, and the difference is zero. Therefore, high-frequency signals provided for the laser through differential signals can enhance anti-interference capability of signals, and effectively inhibit electromagnetic interference on the circuit.

Referring to FIG. 9 to FIG. 12, to ensure that electric field lines from the conductive path 11b to the first conductive interlayer 12 are evenly and densely distributed, the reference layer is electrically connected to the conductive paths 11a and 11c configured to provide a ground wire via a plurality of evenly distributed through-holes 4b. As electric field lines near the through-holes are distributed densely, the reference layer is separately connected to the conductive path 11a and the conductive path 11c via a plurality of evenly distributed through-holes 4b, so that the electric field lines from the entire conductive path 11b to the first conductive interlayer 12 are distributed more densely and evenly.

Figure 9:
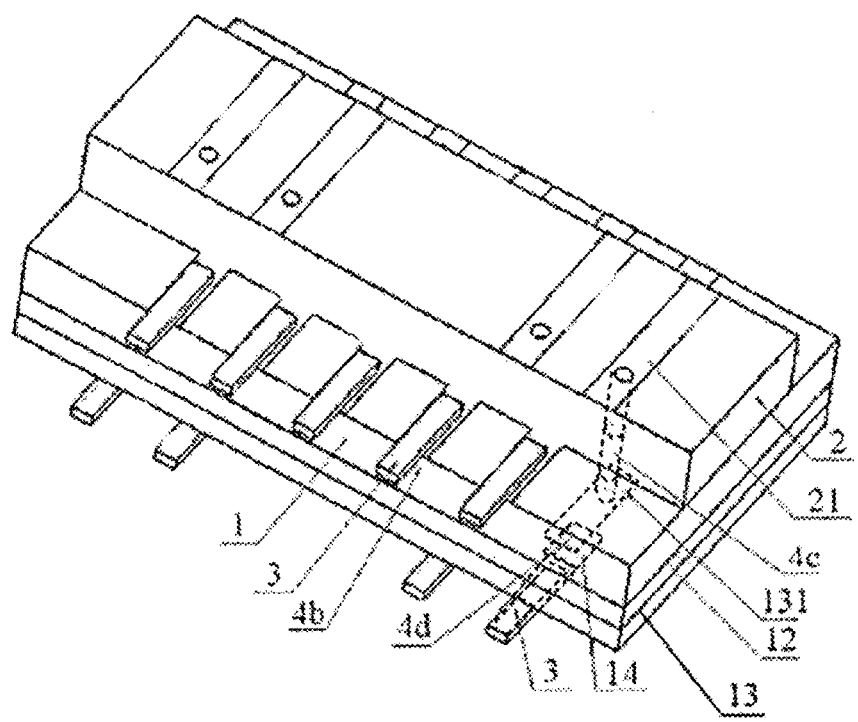
FIG. 9 is a schematic view of a first conductive interlayer and a second conductive interlayer disposed in a connection structure according to an embodiment of the present disclosure.
Figure 10:
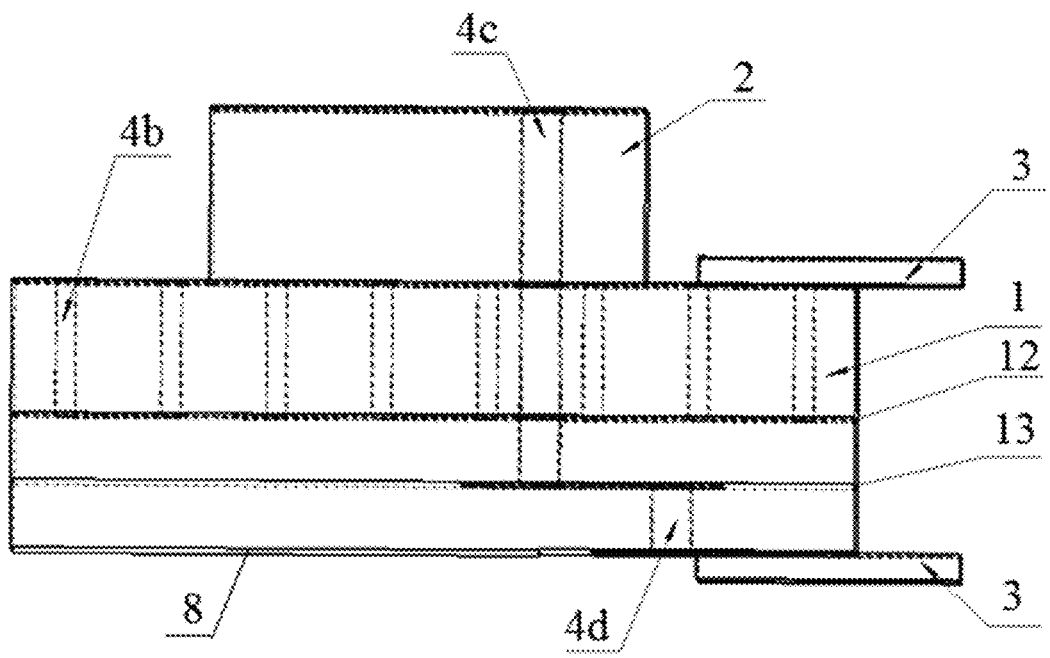
FIG. 10 is a side view of a first conductive interlayer and a second conductive interlayer disposed in a connection structure according to an embodiment of the present disclosure.

Referring to FIG. 9 and FIG. 10, when a bottom surface of the connection structure is welded to a metal housing, the conductive path 14 on the lower surface of the first insulation substrate 1 is disposed near an outer end of the lower surface of the first insulation substrate 1. The lower surface of the first insulation substrate 1 is provided near an inner end thereof with a metal layer 8 configured to weld to the laser housing. The metal layer 8 is disposed with the conductive path 14 on the lower surface of the first insulation substrate 1 at an interval. As a pin 3 is welded to an outer end of the conductive path 11 on the upper surface of the first insulation substrate 1, the second insulation substrate 2 shall be disposed at a relatively inner position on the upper surface of the first insulation substrate 1 to keep away from the pin 3, thereby exposing an outer end on the upper surface of the first insulation substrate 1. Thus, a through-hole on the second insulation substrate 2 is also located at a relatively inner position. In this case, if the through-hole directly penetrates from the upper surface of the second insulation substrate 2 into the lower surface of the first insulation substrate 1, it may easily cause the through-hole to be in contact with the metal layer 8. Therefore, to avoid occurrence of this case, a second conductive interlayer 13 is further provided between the first conductive interlayer 12 and the lower surface of the first insulation substrate 1. The second conductive interlayer 13 includes a plurality of conductive paths 131. The conductive paths 21 on the upper surface of the second insulation substrate 2 respectively correspond to and are electrically connected to the conductive paths 131 of the second conductive interlayer 13 via a through-hole 4c. The conductive paths 131 of the second conductive interlayer 13 respectively correspond to and are electrically connected to the conductive path 14 on the lower surface of the first insulation substrate 1 via a through-hole 4d. Then, the conductive paths 21 on the upper surface of the second insulation substrate 2 are connected to the conductive paths 131 of the second conductive interlayer 13 via the through-hole 4c, and connected to the conductive path 14 on the lower surface of the first insulation substrate 1 via the through-hole 4d. The through-hole 4d is more close to the outer end of the first insulation substrate 1 compared with the through-hole 4c, thereby avoiding contact with the metal layer 8.

An embodiment of the present disclosure further provides a laser assembly, including a housing (not marked in the figure). The housing is provided inside with a heat sink 5, which is preferably an aluminum nitride heat sink. The heat sink 5 includes a laser 6, that is, of a COC (chip-on-carrier, chip-aluminum nitride heat sink) structure. Compared with a conventional COSOC (chip-on-submount-on-carrier, chip-small heat sink-aluminum nitride heat sink) structure of a laser, the structure reduces the number of times of welding during installation, and decreases the thickness of vertical heat transfer. In this way, the required cooling capacity and power consumption of the cooler are reduced. The laser assembly further includes a connection structure for a laser as described above. An end of the connection structure far away from the pin 3 is inserted into the housing for the convenience of connection to the laser. The conductive path of the connection structure is electrically connected to the laser 6 in a metal wire bonding manner. The wire bonding refers to a technology of connecting a chip with a lead frame by using a metal wire with a wire diameter of 15 to 50 micrometers, so as to make a tiny chip communicate with an external circuit without adding an excessively great area.

In the laser assembly provided by this embodiment of the present disclosure, to supply power to the laser 6 and another electrical component (not marked in the figure) via the pin 3, a connection structure is disposed on a housing thereof. The laser 6 is connected to a conductive path 11 on an upper surface of a first insulation substrate 1 of the connection structure via a metal wire in a wire bonding manner, so as to achieve transmission of high-frequency signals. The laser 6 is also connected to a conductive path 21 on an upper surface of a second insulation substrate 2 in a same connection manner. As the conductive path 21 on the upper surface of the second insulation substrate 2 is connected to the conductive path 14 on the lower surface of the first insulation substrate 1 via a through-hole 4a, the laser is connected to the conductive path 14 on the lower surface of the first insulation substrate 1, thereby achieving an electrical connection of the laser 6 and the conductive paths distributed on the upper and lower surfaces of a same substrate. Compared with the existing technology, the connection structure of the present disclosure achieves, by means of adopting a solution of transferred connection via a through-hole, simultaneous electrical connection of a laser and pins distributed on an upper surface and a lower surface of a same substrate, so that a pin on an upper surface of a lower substrate can be directly configured to transmit of high-frequency signals. As use of a conductive path-abutting transfer structure is avoided, a problem of impedance non-matching will not occur.

In the existing technology, a laser includes two classes, a directly-modulated laser and an externally-modulated laser. For a common directly-modulated laser, such as a distributed feedback laser, the laser can be driven only by means of providing high-frequency signals; and for a common externally-modulated laser, such as a electro-absorption modulated laser, the laser can be driven by means of providing both high-frequency signals and direct current signals. The direct current signals are mainly configured to provide power supply to a semi-conductor cooler in an optical device, signal return of a thermistor, return of detection current of a backlight detection unit, and the like. When the laser is a directly-modulated laser, the conductive path 11 on the upper surface of the first insulation substrate 1 is configured to transmit or receive high-frequency signals. When the laser is an externally-modulated laser, the conductive path 11 on the upper surface of the first insulation substrate 1 is used partly for connection of high-frequency signals, and partly for connection of direct current signals. The conductive path on the upper surface of the second insulation substrate is configured to be connected to direct current signals.

The above descriptions are merely specific implementation manners of the present disclosure, but are not intended to limit the protection scope of the present disclosure. Any change or replacement easily obtained by a person skilled in the art within the disclosed technical scope of the present disclosure shall fall within the protection scope of the present disclosure. Therefore, the protection scope of the present disclosure shall be subject to the protection scope of the claims.

What is claimed is:

1. A device for a laser, comprising:
   a first insulation substrate, wherein:
      the first insulation substrate comprises a first upper surface and a first lower surface,
      the first upper surface of the first insulation substrate comprises a first upper conductive path, and
      the first lower surface of the first insulation substrate comprises a first lower conductive path;
   a second insulation substrate disposed on the first upper surface of the first insulation substrate, wherein:
      the second insulation substrate comprises a second upper surface, and
      the second upper surface of the second insulation substrate comprises a second upper conductive path;
   a first conductive interlayer is disposed inside the first insulation substrate, wherein:
      the second upper conductive path electrically connects to the first conductive interlayer, and
      the first conductive interlayer electrically connects to the first lower conductive path; and
   wherein:
      the first lower conductive path is disposed near a first end of the first lower surface, and
      a metal layer is disposed near a second end of the first lower surface, wherein:
         the metal layer is configured to electrically connect to an enclosure enclosing the first insulation substrate and the second insulation substrate, and
         the metal layer and the first lower conductive path are disposed at an interval.

2. The device according to claim 1, wherein:
   the second upper conductive path, via a first through-hole, electrically connects to the first conductive interlayer; and
   the first conductive interlayer, via a second through-hole, electrically connects to the first lower conductive path.

3. The device according to claim 2, wherein:
   the first through-hole is disposed on top of the second through-hole to form a long through-hole.

4. The device according to claim 2, wherein:
   the first through-hole is displaced from the second through-hole.

5. The device according to claim 1, wherein:
   a second conductive interlayer is disposed inside the first insulation substrate; and
   the second conductive interlayer electrically connects to a portion of the first upper conductive path via at least one third through-hole.

6. The device according to claim 5, wherein:
   the second conductive interlayer is disposed between the first conductive interlayer and the first upper surface.

7. The device according to claim 5, wherein:
   a number of the at least one third through-hole is larger than two; and
   the at least one third through-hole distributes evenly.

8. The device according to claim 5, wherein:
   the portion of the first upper conductive path is configured to electrically connect to a ground electrode; and
   the second conductive interlayer is configured to electrically connect to the ground electrode.

9. The device according to claim 1, wherein:
   the second insulation substrate comprises a notch on an end part of the second insulation substrate; and
   the notch exposes an end part of the first upper conductive path.

10. The device according to claim 1, wherein:
    the second insulation substrate covers a portion of the first upper surface of the first insulation substrate to expose an end part of the first upper conductive path.

11. The device according to claim 1, wherein:
    projection of the second upper conductive path onto the first upper surface of the first insulation substrate partly overlaps with the first upper conductive path.

12. The device according to claim 1, wherein:
    projection of the second upper conductive path onto the first upper surface of the first insulation substrate does not overlap with the first upper conductive path.

13. The device according to claim 1, wherein:
    projection of the second upper conductive path onto the first lower surface of the first insulation substrate partly overlaps with the first lower conductive path.

14. A laser assembly, comprising:
    an enclosure enclosing a laser and a device, the device comprising:
       a first insulation substrate, wherein:
          the first insulation substrate comprises a first upper surface and a first lower surface,
          the first upper surface of the first insulation substrate comprises a first upper conductive path, and
          the first lower surface of the first insulation substrate comprises a first lower conductive path;
       a second insulation substrate disposed on the first upper surface of the first insulation substrate, wherein:
          the second insulation substrate comprises a second upper surface, and
          the second upper surface of the second insulation substrate comprises a second upper conductive path;
       a first conductive interlayer is disposed inside the first insulation substrate, wherein:
          the second upper conductive path electrically connects to the first conductive interlayer via a first through-hole, and
          the first conductive interlayer electrically connects to the first lower conductive path via a second through-hole; and
    wherein:
       a second conductive interlayer is disposed inside the first insulation substrate, and
       the second conductive interlayer electrically connects to a portion of the first upper conductive path via at least one third through-hole.

15. The laser assembly according to claim 14, wherein:
    a portion of the first upper conductive path electrically connects to the laser in a wire bonding manner; and a portion of the second upper conductive path electrically connects to the laser in the wire bonding manner.

16. The laser assembly according to claim 15, wherein:
a portion of the first upper conductive path electrically connects to the laser in the wire bonding manner for connection of high-frequency signals; and
a portion of the second upper conductive path on the second upper surface of the second insulation substrate electrically connects to the laser in the wire bonding manner for connection of direct current signals.

17. The laser assembly according to claim 15, wherein:
a metal wire used in the wire bonding manner has a diameter between 15 micrometers and 50 micrometers.

18. The laser assembly according to claim 14, further comprising:
a modulator disposed in the enclosure;
a thermistor disposed in the enclosure; and
a backlight detection unit disposed in the enclosure.

* * * * *